Aug. 16, 1966 H. S. EVANDER 3,267,341
DOUBLE CONTAINER ARRANGEMENT FOR TRANSISTORS
Filed Feb. 9, 1962
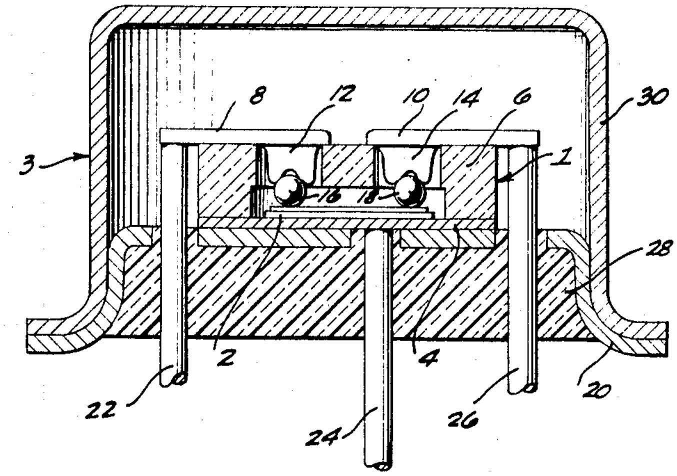
INVENTOR.
HERBERT S. EVANDER,
BY
W. Hume Allister Jr.
ATTORNEY.

United States Patent Office 3,267,341
Patented August 16, 1966

3,267,341
DOUBLE CONTAINER ARRANGEMENT FOR TRANSISTORS

Herbert S. Evander, Santa Ana, Calif., assignor to Hughes Aircraft Company, Culver City, Calif., a corporation of Delaware Filed Feb. 9, 1962, Ser. No. 172,339
1 Claim. (Cl. 317—234)

This invention relates to electrical devices and to packages therefor. More particularly the invention relates to semiconductor devices and to packages therefor which permit a given device to be heremetically sealed within a package of one design and then provided in other package structures of any predetermined size and shape.

It has been necessary to provide semiconductor devices, such as transistors for example, in a package which is hermetically sealed so as to protect the transistor against deleterious effects of the atmosphere. By now, the users of such devices have designed relatively complex electronic equipment around transistor package designs and sizes so that certain of these package designs and sizes have become standard. In general these industry-standardized packages comprise a metallic cap portion and a glass-to-metal header hermetically sealed thereto, as by welding, with the semiconductor device disposed within the package on the metal header. Electrical connections to the operative portions of the device are generally provided by lead wires which pass through the header and are electrically insulated therefrom by means of glass fused thereto. Such standard transistor package designs are commonly designated as the TO5, the TO18, and the TO46, the principal difference between these packages being one of size.

The continued development of complex electronic equipment imposes greater demands on manufacturers of semiconductor devices to provide devices and packages which are smaller and lighter. Such a miniaturized device is shown and claimed in the co-pending application of the present inventor and Karl Reissmueller, Serial No. 172,338 filed concurrently herewith this date and assigned to the instant assignee, now Patent No. 3,202,888.

It will thus be appreciated as the industry requires smaller packages and devices, the manufacturer thereof is faced with an increasing inventory of obsolescent sized parts. Thus, for example, if a particular transistor type which is currently provided in a TO5 package is needed in the smaller TO18 version, the manufacturer must produce a complete line of this device family in the TO18 version. Because of the statistical nature of transsistor production, transistor types of other electrical characteristics are produced in the TO18 package version for which there may be no present desired usage. That is, these transistor types may be desired because of their electrical characteristics but not in the TO18 package. Hence, an undesirable inventory of such transistor types is built up.

It is therefore an object of the present invention to provide an improved semiconductor device package whereby all semiconductor devices are provided in the same hermetically sealed package which may then be further disposed and provided to the user in any other desired package configuration.

The invention will be described in greater detail by reference to the drawings in which the sole figure is a cross-sectional, elevational view of a semiconductor device packaged in accordance with the present invention.

The semiconductor device shown in the drawings comprises a semiconductor crystal body 2 having on one surface thereof base and emitter electrode portions as more fully described in the aforementioned co-pending application.

Briefly, the upper surface of the semiconductor body 2, which may be of N-type material, is provided with a small portion of P-type material concentrically disposed around and under another portion of N-type material, thus forming an N–P–N transistor structure. The small N-type region may constitute an emitter electrode portion while the surrounding P-type region may constitute a base electrode portion. Such devices are well-known in the art and it is not believed that further description thereof is necessary herein except to say that the bulk of the semiconductor body may constitute the collector electrode portion and connection thereto may be made on the surface of the semiconductor body opposite to the surface containing the base and emitter electrode portions. Alternately, the semiconductor device may be constituted of the familiar P–N–P structure, as well.

The semiconductor body 2 is placed on an electrically conductive plate or cap member 4 and is ohmically secured thereto whereby the plate constitutes the terminal for the collector region of the semiconductor device. As taught in the aforementioned co-pending application, large area contact portions are provided on the base and emitter electrode surface of the semiconductor body 2 which large area contact portions are electrically connected to the much smaller base and emitter electrode portions respectively. An electrically insulating envelope 6 is placed around the semiconductor device 2 and is positioned on the collector terminal cap or plate 4 and hermetically sealed thereto. Connections to the emitter and base electrodes are provided by combination cap and lead members 8 and 10 which have prongs or extensions 12 and 14 extending into openings in the envelope 6. The combination cap and lead members 8 and 10 are hermetically sealed to the end of the envelope 6. The prongs or extensions 12 and 14 contact electrically conductive bodies or spheres 16 and 18 which in turn rest upon the large area contact portions. The whole assembly may be heated at one time so as to hermetically seal the cap members 4, 8, and 10 to the electrically insulating envelope 6 and to fuse the metallic spheres 16 and 18 to the large area contacts on the crystal body surface and to the lead extensions 12 and 14 to thus provide a first hermetically sealed container 1 for the semiconductor device 2.

The thus-packaged device is then mounted on the surface of an inverted metallic dish-shaped member or header 20 and secured thereto by soldering or the like. The header 20 is provided with lead wires 22, 24, and 26 which extend therethrough in openings therein and which are electrically insulated from the header 20 by means of glass or polymerized plastic material 28. One lead such as lead 24 may be cut off so as to be relatively flush with the upper surface of the header 20 whereby the flush end of this lead may also be soldered or otherwise electrically connected to the collector terminal plate 4. The lead portions of the combination cap and lead members 8 and 10 may be extended outwardly to contact the lead wires 22 and 26 to which they may then be welded.

The final procedure is to place a cup-shaped cap member 30 over the header assembly and secure the two together again as by welding or the like to thus form a second container 3 for the semiconductor device 2. Inasmuch as the semiconductor device 2 is hermetically sealed in the first container 1 described, the cap member 30 of the second container 3 does not necessarily need to be hermetically sealed to the header 20. Although the configuration shown is substantially that of the industry-standard TO5 package, other external package configurations may be employed.

It will thus be appreciated that all semiconductor devices of any given electrical type may be first manufactured and packaged in the microminiature package 1 described and maintained in inventory in this package for as long as desired. Devices of any particular type may thus be supplied to the user in a microminiature package 1, or in any other of the standard package configurations 3, as shown. One advantage of providing the microminiature package 1 in the larger container 3 is that the device will operate at a lower temperature under given dissipation or at a higher temperature with increased dissipation since the external package functions as an effective heat sink for the device. In addition, because the external package does not need to be hermetically sealed, it can be made of materials selected for other desirable properties such as resistance to mechanical stress or corrosion.

What is claimed is:

A semiconductor apparatus comprising, in combination, a transistor, a first container and a second container; said transistor having an emitter and base electrodes disposed on a first surface of a semiconductor crystal and a collector electrode disposed on another surface of said crystal; said first container including a metallic plate, a ceramic wall portion sealed thereto, and electrically isolated metallic end members forming the other end of said container and having portions extending beyond the outisde dimension of said ceramic wall; said transistor being disposed in said first container with said collector electrode being in contact with said metallic plate; means electrically connecting said base and emitter electrodes to different ones of said electrically isolated metallic end members; said second container comprising a metallic cap member and a metallic header member joined thereto; said first container being mounted in said second container on said metallic header member thereof; said second container having lead members extending into said header members and electrically insulated therefrom and being, respectively, in physical contact with said metallic plate and said extended portions of said isolated end members of said first container.

References Cited by the Examiner

UNITED STATES PATENTS

| | | | |
|---|---|---|---|
| 2,853,661 | 9/1958 | Houle et al. | 317—235 |
| 2,881,370 | 4/1959 | Colson | 317—234 |
| 2,899,610 | 8/1959 | Van Amstel | 317—234 |
| 2,934,588 | 4/1960 | Ronci | 317—235 |
| 2,989,669 | 6/1961 | Lathrop | 317—235 |
| 3,001,113 | 9/1961 | Mueller | 317—234 |

FOREIGN PATENTS

| | | |
|---|---|---|
| 1,266,244 | 5/1961 | France. |

JOHN W. HUCKERT, *Primary Examiner.*

JAMES D. KALLAM, E. PUGH, J. D. CRAIG, *Assistant Examiners.*